(12) United States Patent
Ishino et al.

(10) Patent No.: US 8,598,458 B2
(45) Date of Patent: Dec. 3, 2013

(54) ELECTRONIC DEVICE AND METHOD OF MANUFACTURING THE SAME

(75) Inventors: Hiroshi Ishino, Okazaki (JP); Takao Izumi, Obu (JP); Kazuhiro Tsuruta, Nishio (JP); Nobuyuki Kato, Nisshin (JP)

(73) Assignee: DENSO CORPORATION, Kariya (JP)

( * ) Notice: Subject to any disclaimer, the term of this patent is extended or adjusted under 35 U.S.C. 154(b) by 289 days.

(21) Appl. No.: 13/020,198

(22) Filed: Feb. 3, 2011

(65) Prior Publication Data

US 2011/0192630 A1    Aug. 11, 2011

(30) Foreign Application Priority Data

Feb. 9, 2010  (JP) .................................. 2010-26636

(51) Int. Cl.
*H02G 3/02* (2006.01)
*H05K 1/16* (2006.01)
*H05K 7/02* (2006.01)
*H05K 3/34* (2006.01)
*H01L 23/06* (2006.01)

(52) U.S. Cl.
USPC ............. 174/76; 174/260; 174/252; 174/257; 361/807; 361/760; 361/764; 257/705; 257/741; 257/692; 29/840

(58) Field of Classification Search
None
See application file for complete search history.

(56) References Cited

U.S. PATENT DOCUMENTS

| 5,541,366 A * | 7/1996 | Maoz et al. ................... 174/258 |
| 2009/0096100 A1 | 4/2009 | Kajiwara et al. |
| 2010/0044086 A1* | 2/2010 | Takai et al. ................... 174/257 |
| 2010/0187678 A1 | 7/2010 | Kajiwara et al. |

FOREIGN PATENT DOCUMENTS

| JP | A-11-354575 | 12/1999 |
| JP | A-2003-124406 | 4/2003 |
| JP | A-2006-032617 | 2/2006 |
| JP | A-2008-147469 | 6/2008 |
| JP | A-2011-077225 | 4/2011 |

OTHER PUBLICATIONS

Office Action mailed Jan. 31, 2012 in corresponding JP application No. 2010-26636 (English translation attached.).
Office Action mailed Apr. 2, 2013 in corresponding JP application No. 2012-055867 (and English translation).

* cited by examiner

*Primary Examiner* — Jayprakash N Gandhi
*Assistant Examiner* — Dion Ferguson
(74) *Attorney, Agent, or Firm* — Posz Law Group, PLC

(57) ABSTRACT

An electronic device includes an electronic component, a joining member to be mechanically joined with the electronic component, and a metal conductor located between the electronic component and the joining member to mechanically join the electronic component and the joining member. The metal conductor is made of porous noble metal to have pores, and includes an end surface without being covered by the electronic component and the joining member. Furthermore, a reinforcing resin is impregnated from the end surface of the metal conductor to the pores inside of the metal conductor, so as to mechanically reinforce the metal conductor.

13 Claims, 7 Drawing Sheets

ELECTRONIC DEVICE AND METHOD OF MANUFACTURING THE SAME

CROSS REFERENCE TO RELATED APPLICATION

This application is based on Japanese Patent Application No. 2010-026636 filed on Feb. 9, 2010, the contents of which are incorporated herein by reference in its entirety.

FIELD OF THE INVENTION

The present invention relates to an electronic device and a method of manufacturing an electronic device. For example, the electronic device includes an electronic component mechanically joined to a member to be joined via a metal conductor made of a porous noble metal material.

BACKGROUND OF THE INVENTION

In an electronic device, an electronic component such as an IC chip or a power element, is mechanically joined to another component such as a wiring board or a lead frame, through a joining material. Furthermore, the mechanically joined components are sealed by using a mold resin For example, solder such as Pb-free solder which does not contain Pb has been used, in recent years. The electronic component may be used in a high temperature equal to or higher than 200° C. However, Pb-free solder which can be used in such high temperature has not been found, at the present time.

Patent Document 1 (JP 2008-147469A) proposes an electronic device, in which an electronic component is mechanically joined to a member to be joined via a metal conductor made of a porous noble metal material as a joining material. The metal conductor is formed by sintering a mixture of Ag particles and an organic material. The sintered Ag material is formed into a porous shape.

The electronic device includes an electronic component such as an IC chip, a power element, etc., which has a large-scale integrated circuit. In recent years, because the power density rises in the electronic component, heat generation amount generated from the electronic component tends to increase, and thereby it is necessary to use a joining material having a high heat conductivity.

The inventors of the present applicant studied about the electronic device of Patent Document 1, in which the electronic component is mechanically joined to the member to be joined via the porous metal conductor. As an example, the Ag metal conductor has a high heat conductivity (for example, 420 W/mK), and is sintered to be used for the metal joining.

However, when the porous metal conductor is used for the metal joining, the mechanical strength of the metal joining is relatively low because the contact surfaces between the metal particles are small in the metal joining.

In order to increase the mechanical strength, the joining portion between the electronic component and the member to be joined may be sealed by using a mold resin.

In this case, the mold resin can be used to restrict a bending of the metal conductor generated due to the difference of coefficients of linear expansion between the components, thereby reinforcing the mechanical strength of the metal conductor.

However, the end surface of the metal conductor is also sealed by using the mold resin via a primer, because the end surface of the metal conductor is exposed between the electronic component and the member to be joined. The metal conductor made of noble metal, such as Ag, as described above, generally has hydrophobicity, and thereby the adhesiveness of the metal conductor with respect to the mold resin or the primer is relatively low.

Thus, even when the connection portion of the metal conductor is sealed by the mold resin, the mold resin and the primer may be easily separated from the metal conductor.

SUMMARY OF THE INVENTION

In view of the foregoing problems, it is an object of the present invention to effectively improve the strength of a metal conductor, in an electronic device in which an electronic component is mechanically joined with a joining member via the metal conductor made of porous noble metal.

According to an aspect of the present invention, an electronic device includes an electronic component, a joining member to be mechanically joined with the electronic component, and a metal conductor arranged between the electronic component and the joining member to mechanically join the electronic component and the joining member. The metal conductor is made of porous noble metal to have pores, and includes an end surface without being covered by the electronic component and the joining member. Furthermore, a reinforcing resin is impregnated from the end surface of the metal conductor to an inside of the metal conductor, to mechanically reinforce the metal conductor. Thus, the strength of the metal conductor can be effectively increased.

According to another aspect of the present invention, an electronic device includes an electronic component, a joining member to be mechanically joined with the electronic component, and a metal conductor arranged between the electronic component and the joining member to mechanically join the electronic component and the joining member. The metal conductor is made of porous noble metal to have pores, and includes an end surface without being covered by the electronic component and the joining member. Furthermore, the electronic device includes: a mold resin configured to seal the electronic component, the joining member and the end surface of the metal conductor; a primer arranged at least between the end surface of the metal conductor and the mold resin to increase an adhesiveness therebetween; and a reinforcing resin impregnated from the end surface of the metal conductor to an inside of the metal conductor, to mechanically reinforce the metal conductor. In addition, the reinforcing resin is made of a resin material having a higher adhesion strength with the primer than the metal conductor.

Thus, the reinforcing resin can be stably held in the metal conductor, thereby suitably improving the mechanical strength of the metal conductor. Furthermore, the primer is arranged at least between the end surface of the metal conductor and the mold resin to increase an adhesiveness therebetween, and the reinforcing resin is made of a resin material having a higher adhesion strength with the primer than the metal conductor. Therefore, adhesiveness between the primer and the metal conductor can be increased via the reinforcing resin. In addition, because the mold resin is configured to seal the electronic component, the joining member and the end surface of the metal conductor, the position of the metal conductor can be accurately maintained while restricting a bending or a shift of the metal conductor.

For example, the primer and the reinforcing resin may be made of the same resin material. As an example, the metal conductor is made of silver (Ag), and the primer and the reinforcing resin are made of polyimide. In this case, the reinforcing resin may be impregnated from the end surface of the metal conductor to the inside of the metal conductor by an impregnation depth that is equal to or larger than 30 µm.

In a cross section of the metal conductor, the metal conductor before impregnation of the reinforcing resin has: a largest dimension of metal particles contained in the metal conductor as a metal particle diameter; a largest dimension of the pores contained in the metal conductor as a pore diameter; and a ratio of areas of the pores to an entire area on the cross section of the metal conductor as a pores ratio. In this case, the metal particle diameter may be in a range of 0.1 to 30 µm, the pore diameter may be in a range of 0.1 to 50 µm, and the pores ratio may be in a range of 5 to 40%, in the cross section of the metal conductor.

In the electronic device, a thickness of the primer on the end surface of the metal conductor may be set in a range of 0.2 to 3 µm. Furthermore, a ratio of Young's modulus of the mold resin to Young's modules of the electronic component may be in a range of ½ to 2, and a ratio of Young's modulus of the reinforcing resin to the Young's modulus of the mold resin may be in a range of $1/100$ to $1/10$.

Alternatively, the metal conductor may be made of silver (Ag), and the reinforcing resin may be made of polyimide.

According to another aspect of the present invention, a method of manufacturing an electronic device includes of a step of mechanically joining an electronic component and a joining member via a metal conductor made of a porous noble metal such that the metal conductor has an end surface without being covered by the electronic component and the joining member, a step of applying a paste made of a resin material and a diluent for diluting the resin material, and a step of decompressing a space around the metal conductor to a pressure lower than an atmosphere pressure and lower than a vapor pressure of the diluent to evaporate and remove the diluent in the pores while introducing the paste into the pores of the metal conductor, so as to impregnate the resin material from the end surface of the metal conductor into the pores within the metal conductor. Furthermore, the decompressing is performed such that an inside of the metal conductor inside of the resin material is sealed by the resin material, and the inside of the metal conductor inside of the resin material has a pressure lower than a pressure outside of the metal conductor so as to apply a compression force from the outside of the metal conductor to the inside of the metal conductor. Thus, the diluents in the pores can be effectively evaporated and removed, thereby increasing the strength of the metal conductor.

For example, a recess portion may be formed in the joining member at a position outside the end surface of the metal conductor before the mechanically joining. In this case, the applying of the paste is performed such that the paste is stored in the recess portion of the joining member. Therefore, the thickness of the primer can be suitably maintained after the impregnation of the resin material into the metal conductor.

BRIEF DESCRIPTION OF THE DRAWINGS

Other objects, features and advantages of the present invention will become more apparent from the following description made with reference to the accompanying drawings, in which like parts are designated by like reference numbers and in which.

DETAILED DESCRIPTION OF THE PREFERRED EMBODIMENTS

Figure 1:
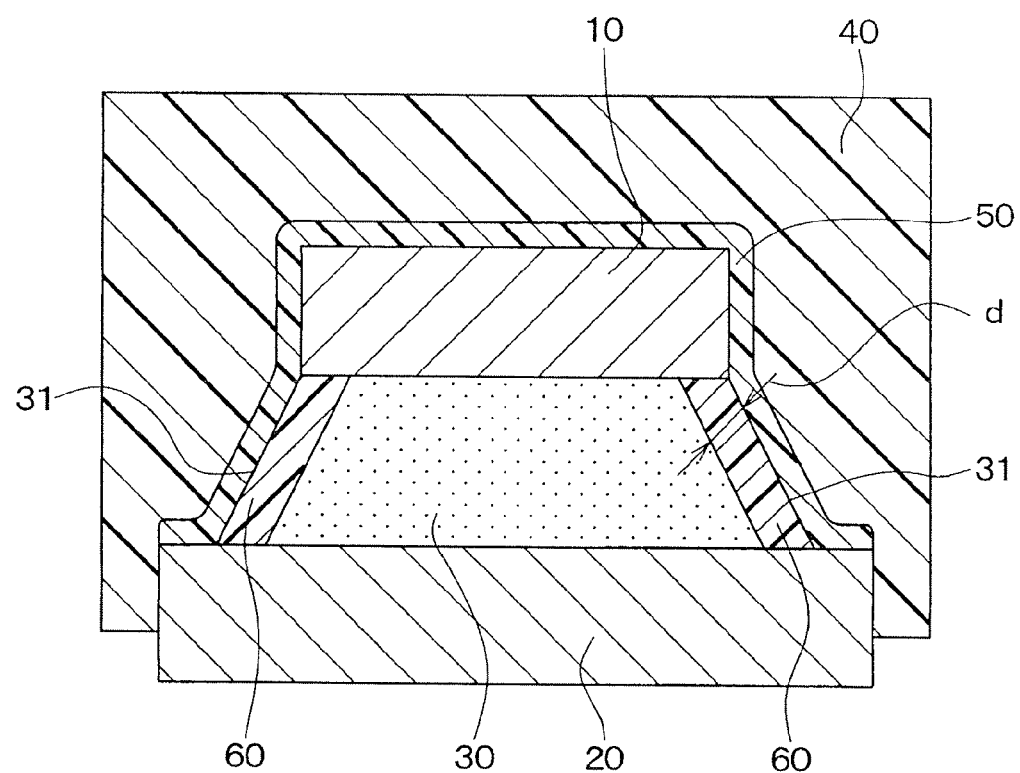
FIG. 1 is a schematic sectional view showing an electronic device according to the first embodiment of the present invention.

Embodiments of the present invention will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

FIG. 1 is a schematic sectional view showing an electronic device according to a first embodiment of the present invention. In the first embodiment, the electronic device includes an electronic component 10, a member 20 to be joined (joining member), a metal conductor 30 configured to mechanically join the electronic component 10 and the joining member 20, and a mold resin 40 configured to seal the electronic component 10, the joining member 20 and the metal conductor 30.

The electronic component 10 may be any electronic part which radiates a large amount of heat when being driven. For example, the electronic component 10 may be an IC chip which has a large-scale integrated circuit, a power element such as a power transistor, etc.

The joining member 20 does not limit a special member. The joining member 20 may be any member to be joined mechanically with the electronic component 10. For example, the joining member 20 mechanically joined with the electronic component 10 may be a common lead frame, a heat sink, or a wiring board such as a printed circuit board and a ceramic substrate, etc.

The metal conductor 30 is arranged between the electronic component 10 and the joining member 20, so that the electronic component 10 and the joining member 20 are mechanically joined to each other via the metal conductor 30. Therefore, the electronic component 10 and the joining member 20 can be fixed by using the metal conductor 30.

In addition, the metal conductor 30 is a conductor having a sufficient thermal conductivity. The electronic component 10 and the joining member 20 are electrically connected via the metal conductor 30, so that electric signal can be transmitted therebetween. Furthermore, the electronic component 10 is thermally connected to the joining member 20 via the metal conductor 30, so that heat can be radiated from the electronic component 10 to the joining member 20.

Figure 6:
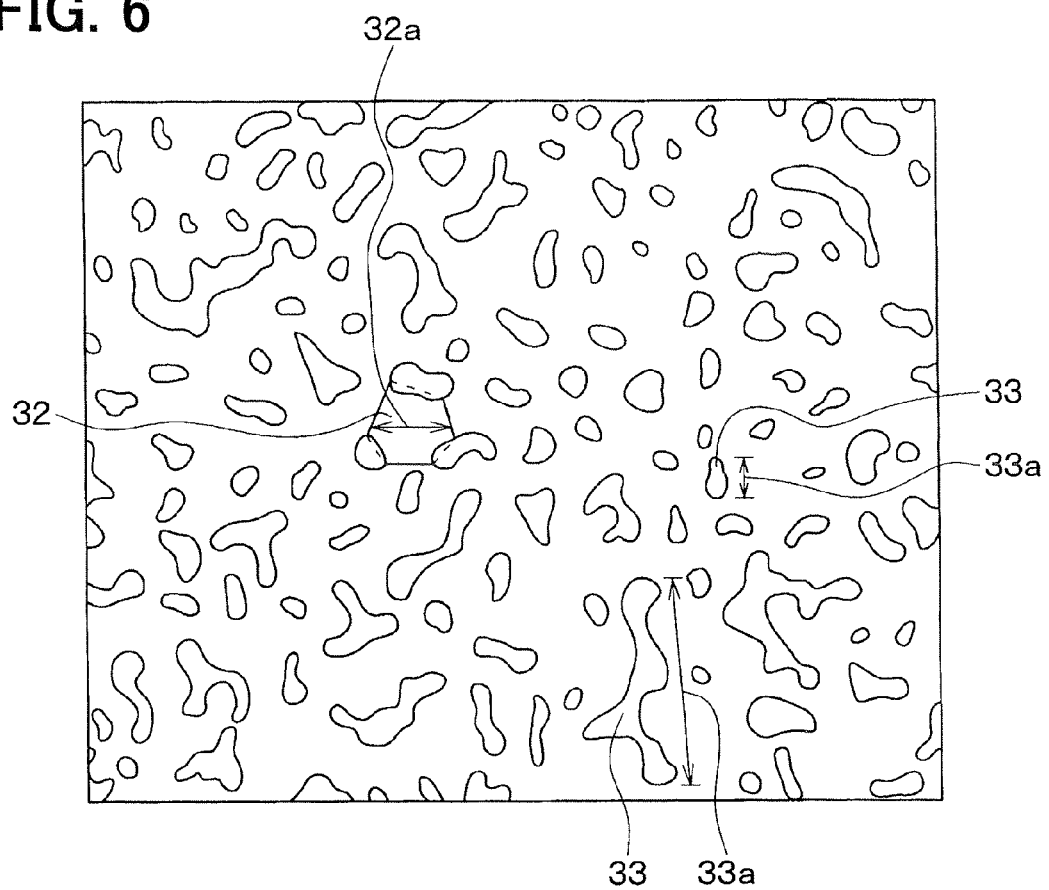
FIG. 6 is a schematic sectional view showing an inside structure of the metal conductor in a state before the impregnation of the reinforcing resin.
Figure 8A:
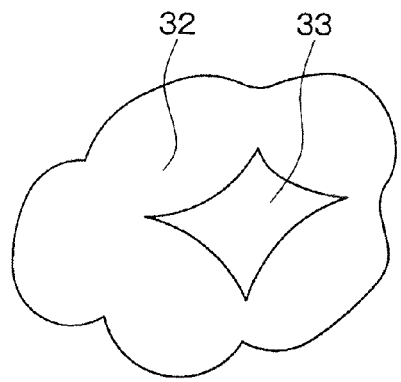
FIG. 8A is a schematic diagram showing an inside structure of the metal conductor in the state before the impregnation of the reinforcing resin.
Figure 8B:
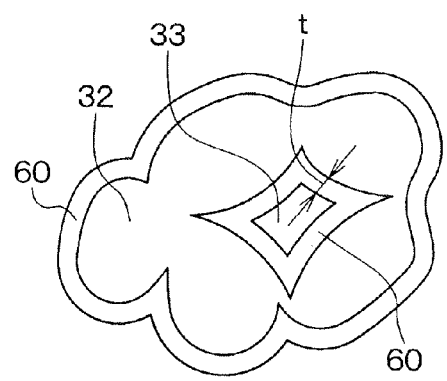
FIG. 8B is a schematic diagram showing the inside structure of the metal conductor in the state after the impregnation of the reinforcing resin.

The metal conductor 30 is made of a noble metal material, and is formed into porous shape having inner pores 33, as shown in FIGS. 6, 8A and 8B. The metal conductor 30 may be made of a noble metal material including one noble metal or plural noble metals as a main component, such as Ag, Au, Cu, Pt, and Pd. For example, the noble metal(s) contained in the metal conductor 30 is 50% or more in the whole metal conductor 30 by the weight.

The metal conductor 30 is formed by sintering a mixture of nano-particles of noble metal and an organic material. The sintered metal particles 32 are formed into a porous shape having the pores 33, as shown in FIGS. 6, 8A and 8B. In the example shown in FIGS. 6, 8A and 8B, as the noble metal of the metal conductor 30, Ag nano-particles are used.

As shown in FIG. 1, the metal conductor 30 has an end surface 31. In the example of FIG. 1, the end surface 31 is the side surface positioned between a top surface of the metal conductor 30 contacting the electronic component 10 and a bottom surface of the metal conductor 30 contacting the joining member 20. That is, the end surface 31 of the metal conductor 30 is the surface of the metal conductor 30, not covered by the electronic component 10 and the joining member 20. Therefore, the end surface 31 of the metal conductor 30 is exposed from the electronic component 10 and the joining member 20.

In the present embodiment, the electronic component 10, the joining member 20, and the end surface 31 of the metal conductor 30 are covered by a mold resin 40 to be sealed. The mold resin 40 is made of an epoxy resin that is generally used as a mold material in the field of the electronic device. The mold resin 40 may be formed from a resin material by using a molding die, or may be formed by applying and hardening a resin material.

A primer 50 can be provided at least between the end surface 31 of the metal conductor 30 and the mold resin 40, in order to increase the adhesiveness between the end surface 31 and the mold resin 40. In the example of FIG. 1, the primer 50 is also placed between the electronic component 10 and the mold resin 40, and between a surface of the joining member 20 and the mold resin 40.

The primer 50 is made of a resin material having a large adhesion strength with the mold resin 40, as compared with the electronic component 10, the joining member 20 and the metal conductor 30. The primer 50 is formed by applying and drying a paste, which is formed by diluting the resin material with a diluent, such as NMP (n-methyl pyrrolidone).

In addition, as shown in FIG. 1, a reinforcing resin 60 is impregnated from the end surface 31 of the metal conductor 30 into the inside of the metal conductor 30. Because the metal conductor 30 is the porous material having the pores 33 inside of the metal conductor 30, impregnation of the reinforcing resin 60 is carried out to the pores 33 of the metal conductor 30. In addition, because the reinforcing resin 60 is also impregnated to the pores 33 opened to the end surface 31, the reinforcing resin 60 is also exposed to the end surface 31 of the metal conductor 30.

Because the reinforcing resin 60 is filled in the pores 33 of the metal conductor 30, the reinforcing resin 60 can be adapted to mechanically reinforce the metal conductor 30. In addition, the reinforcing resin 60 is made of a resin material whose adhesion strength with the primer 50 is higher than the metal conductor 30. As the reinforcing resin 60, polyimide, polyamide, etc., may be used, for example.

For example, the primer 50 and the reinforcing resin 60 may be made of the same resin. As an example, both the primer 50 and the reinforcing resin 60 may be made of polyimide. Alternatively, the reinforcing resin 60 may be made of polyimide, and the primer 50 may be made of polyamide. Alternatively, the reinforcing resin 60 may be made of polyamide, and the primer 50 may be made of polyimide.

Figure 2A:
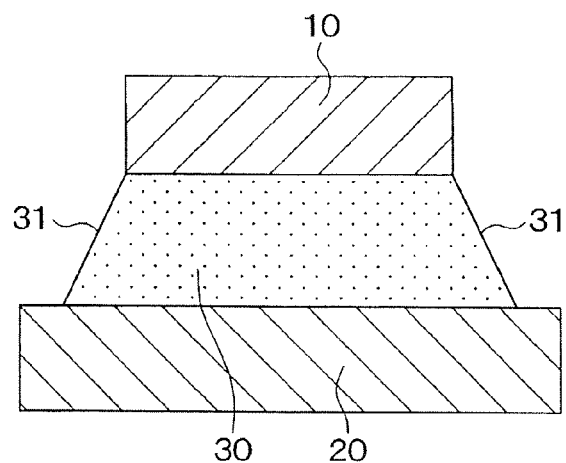
FIGS. 2A, 2B and 2C are schematic sectional views showing a manufacturing method of the electronic device according to the first embodiment.
Figure 2B:
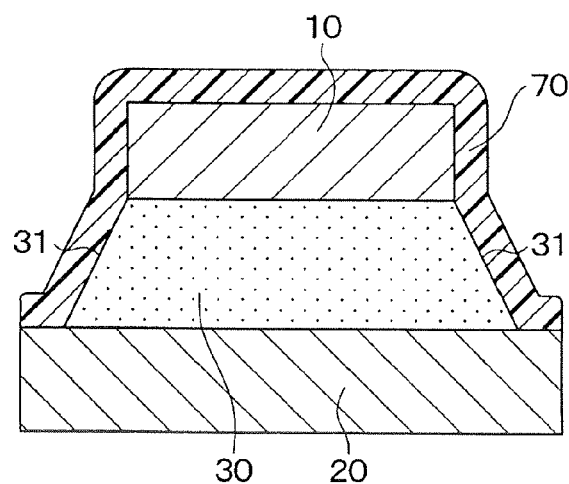
Figure 2C:
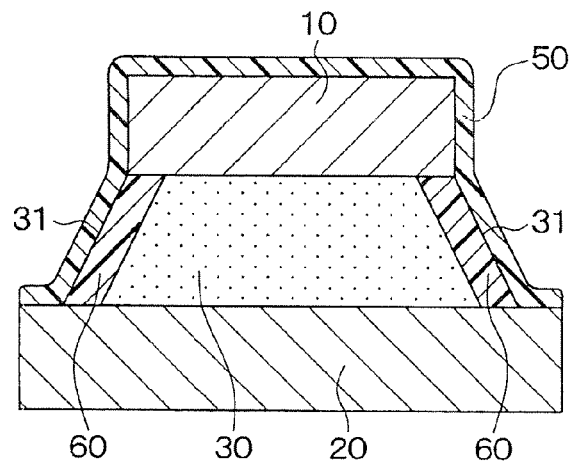

Next, a manufacturing method of the electronic device of the present embodiment will be described with reference to FIGS. 2A, 2B and 2C. FIGS. 2A, 2B and 2C are schematic sectional views showing the manufacturing method of the electronic device.

First, as shown in FIG. 2A, the electronic component 10 and the joining member 20 are mechanically joined via the metal conductor 30. More specifically, after a paste made of Ag nano-particles and organic solvent is applied to the surface of the joining member 20, the electronic component 10 is placed on the paste so as to form a temporal assembly. Then, the temporal assembly is sintered at a temperature in a range about 200-400° C. so that the paste is sintered. Therefore, the metal conductor 30 is formed by the sintered paste, to mechanically join the electronic component 20 and the metal conductor 30.

Next, as shown in FIG. 2B, a paste 70, made of polyimide and NMP as a diluent of polyimide, is applied to the electronic component 10, the joining member 20 and the end surface 31 of the metal conductor 30 by a dispensing method or the like. Here, polyimide is the resin material of both of the primer 50 and the reinforcing resin 60.

After the paste 70 is applied, the paste-applied product is placed in a pressure reduction state. In this case, because the pores 33 inside of the metal conductor 30 becomes in a decompression state, the paste 70 located on the end surface 31 of the metal conductor 30 moves to the inside of the metal conductor 30, i.e., the pores 33 of the metal conductor 30. Then, heating is performed so as to remove the diluent contained in the paste 70.

Thus, as shown in FIG. 2C, the primer 50 is formed as a polyimide layer which is located on the surface of the electronic component 10, a surface of the joining member 20, and the end surface 31 of the metal conductor 30, to cover those surfaces. The reinforcing resin 60 is formed as a layer of the polyimide. That is, the polyimide contained in the paste 70 is impregnated into the inside of the metal conductor 30 from the end surface 31 of the metal conductor 30 by a depth, so that the reinforcing resin 60 with the depth is formed. Then, the sealing due to the mold resin 40 is performed to the product shown in FIG. 2C, thereby forming the electronic device of the present embodiment.

According to the present embodiment, the reinforcing resin 60 is impregnated to the pores 33 of the metal conductor 30, and the reinforcing resin 60 is held inside of the metal conductor 30 by the anchoring effect of the reinforcing resin 60 having entered into the pores 33. Because the pores 33 are filled with the reinforcing resin 60, the mechanical strength of the metal conductor 30 can be suitably improved.

In the present embodiment, because the reinforcing resin 60 is formed inside of the metal conductor 30 by a thickness (depth) from the end surface of the metal conductor 30, the adhesiveness between the primer 50 and the metal conductor 30 can be increased via the reinforcing resin 60. Furthermore, the mold resin 40 is formed on the primer 50 and the joining member 20, a bending of the metal conductor 30 can be restricted, thereby improving accuracy.

In addition, in the above example, the primer 50 and the reinforcing resin 60 are made of the same polyimide resin. In this case, the primer 50 and the reinforcing resin 60 can be formed by one step, thereby simplifying the manufacturing method.

The primer 50 and the reinforcing resin 60 may be made of different resin materials. In this case, the primer 50 and the reinforcing resin 60 are formed at different forming steps. That is, in the state of FIG. 2A, the paste for forming the reinforcing resin 60 is firstly applied to the end surface 31 of the metal conductor 30 and is impregnated into the metal conductor 30 at least by a predetermined thickness. Thereafter, the paste for forming the primer 50 is applied to the electronic component 10, the reinforcing resin 60 and the joining member 20, and drying of the paste is performed.

Next, the effects of the present embodiment will be described in more detail, based on the experiments performed by the inventors of the present application. In the experiments, the metal conductor 30 is made of a material including Ag particles, and the primer 50 and the reinforcing resin 60 are made of the same polyimide.

First, the adhesiveness between the primer 50 and the metal conductor 30 will be described. The inventors studied about the relationship between an adhesion strength and an impregnation thickness (depth d) of the reinforcing resin 60 impregnated into the inside of the metal conductor 30 from the end surface 31. As shown in FIG. 1, the impregnation depth d is the thickness of the reinforcing resin 60 impregnated from the end surface 31 of the metal conductor 30 to the inside of the metal conductor 30.

Figure 3A:
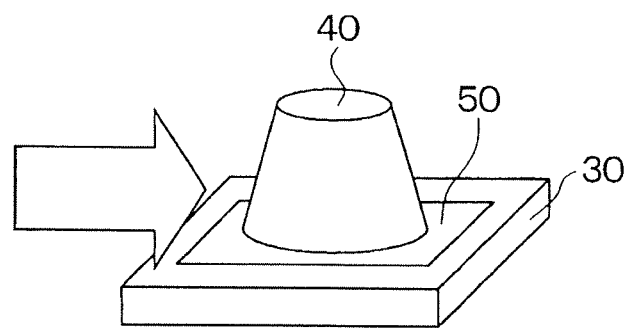
FIGS. 3A and 3B are a perspective view and a schematic sectional view showing a measuring method of a shear strength in the first embodiment.
Figure 3B:
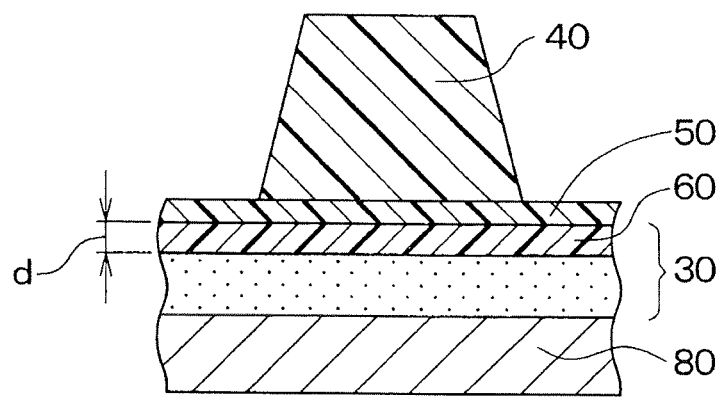

The adhesion strength between the primer 50 and the metal conductor 30 is measured by using a shear strength. FIGS. 3A and 3B are a perspective view and a schematic sectional view showing a measuring method of the shear strength in the first embodiment. The method shown in FIGS. 3A and 3B is generally called as a pudding-cup shearing test.

In the shearing test, the metal conductor 30, in which the reinforcing resin 60 is impregnated by an impregnation depth d, is formed on a lead frame 80. The primer 50 is formed with a predetermined thickness on the metal conductor 30, and a cup-shaped mold resin 40 is formed on the primer 50. Then, a shearing force is applied from the white arrow direction in FIG. 3A to the mold resin 40, and a shearing strength is measured.

Here, the measurement is performed by using a push pull gage as a forming device, in measurement conditions of a room temperature, 150° C., 200° C., and 250° C. by a speed of 5 mm/minute. In addition, the size of the contact surface where the mold resin 40 and the metal conductor 30 are made in contact through the primer 50, is 3 mm. That is, the diameter φ of the circular bottom surface of the mold resin 40 is 3 mm.

In this shearing test, it is necessary to specify the thickness of the primer 50, in first. If the primer 50 is too thin or is too thick, the adhesion strength between the mold resin 40 and the metal conductor 30 becomes insufficient. Therefore, it is required to form the primer 50 and to do a shearing test, by a thickness which can stably realize a high adhesion strength.

A suitable thickness of the primer 50 can be obtained by the following shearing test. The shearing test is performed by using a metal conductor 30 which does not perform impregnation of the reinforcing resin 60 and does not specifically have the reinforcing resin 60. Furthermore, with respect to the metal conductor 30 without having the reinforcing resin 60, the thickness of the primer 50 is changed and the shearing test is performed. The test result is shown in FIG. 4.

Figure 4:
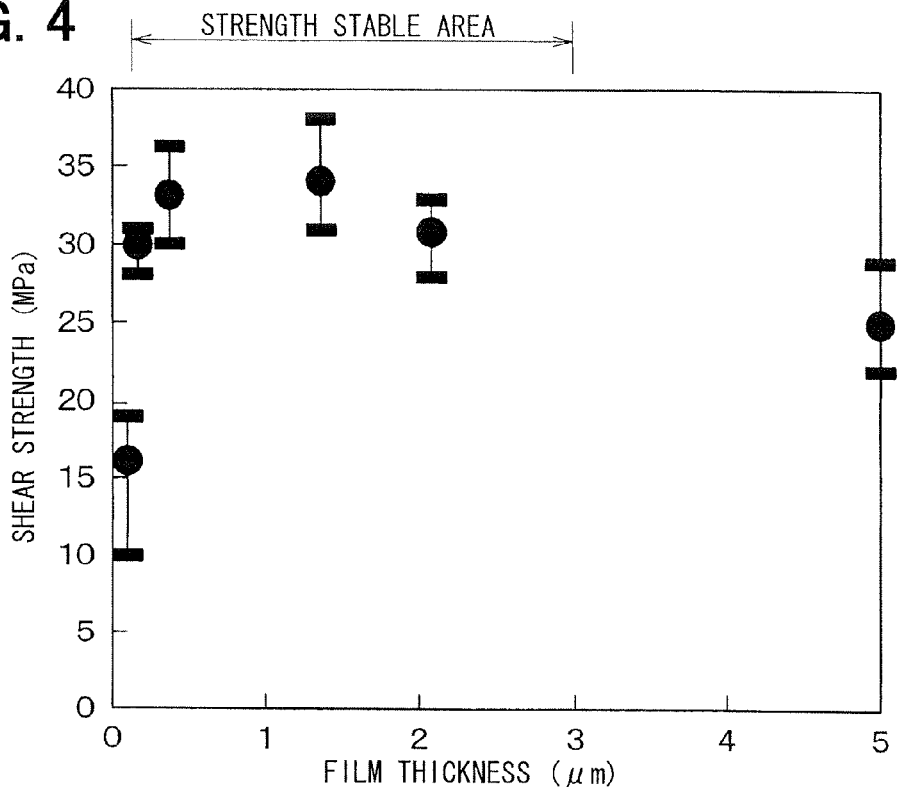
FIG. 4 is a view showing the relationship between a film thickness of a primer, and the shear strength.

FIG. 4 is a view showing the relationship between a film thickness (μm) of the primer 50, and a shear strength (MPa). In FIG. 4, the black dot plot indicates an average value of the shear strength, the top plot of the thick line positioned at the top side of the black dot plot indicates the maximum value of the shear strength, and the bottom plot of the thick line positioned at the bottom side of the black dot plot indicates the minimum value of the shear strength.

If the thickness of the primer 50 is in a range of 0.2-3.0 micrometers (μm), the adhesion strength can be stably and sufficiently increased. However, if the thickness of the primer 50 is less than 0.2 micrometer (μm) or larger than 3.0 micrometers (μm), the adhesion strength is decreased.

Thus, in the electronic device shown in FIG. 1, the thickness of the primer 50 on the end surface 31 of the metal conductor 30 is preferably in a range of 0.2-3.0 micrometers (μm) on the end surface 31 of the metal conductor 30.

Furthermore, in the shearing test, the impregnation depth d of the reinforcing resin 60 is changed, while the thickness of the primer 50 is set in a range of 0.2-3.0 micrometers (μm). The impregnation depth d is changed by changing the degree of decompression when carrying out the impregnation, and the time of impregnation. The test result is shown in FIG. 5.

Figure 5:
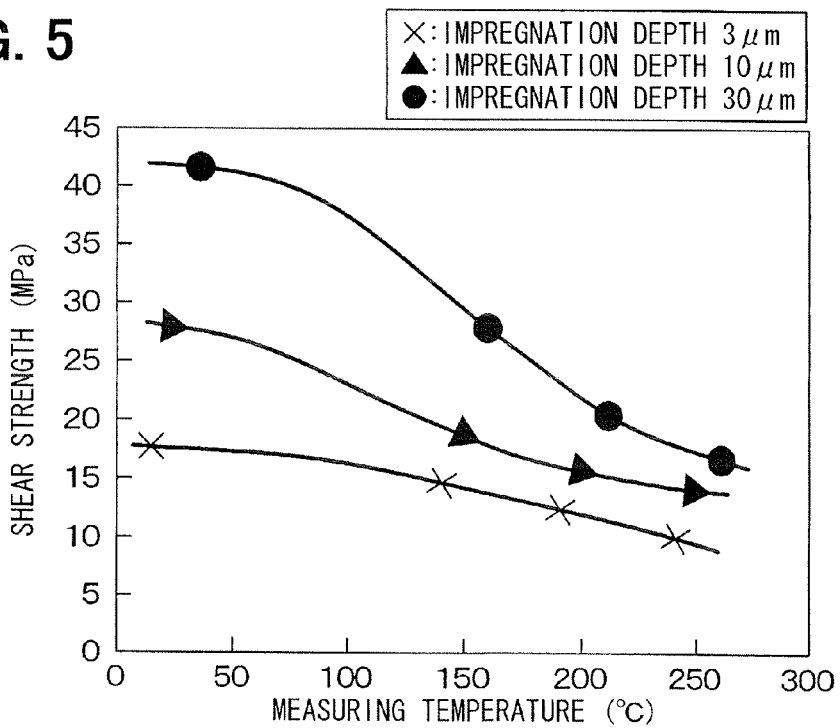
FIG. 5 is a graph showing the relationship between a measuring temperature and the shear strength, when an impregnation depth of a reinforcing resin is changed.

FIG. 5 is a graph showing the relationship between a measurement temperature (° C.) and the shear strength (MPa), when the impregnation depth d of reinforcing resin is changed. Here, the impregnation depth d is changed to 3 micrometers (μm), 10 micrometers (μm), and 30 micrometers (μm). As shown in FIG. 5, as the impregnation depth d becomes larger, the adhesion strength between the primer 50 and the metal conductor 30 becomes larger, and thereby the shear strength becomes larger.

In addition, the breaking point by shearing is examined. When the impregnation depth d is 3 micrometers (μm) or 10 micrometers (μm), the interface between the metal conductor 30 and the primer 50 becomes in the breaking point. In contrast, when the impregnation depth d is 30 micrometers (μm), the breaking point is in the mold resin 40, and the interface between the metal conductor 30 and the primer 50 is not broken. That is, when the impregnation depth d is not less than 30 micrometers (μm), the adhesion strength at the interface of the metal conductor 30 and the primer 50 will become maximum.

Thus, if the impregnation depth d of the reinforcing resin 60 is not less than 30 micrometers (μm), the adhesion strength between the primer 50 and the metal conductor 30 can be sufficiently secured, and thereby the metal conductor 30 can be appropriately restricted at a certain position by the mold resin 40. Here, when the reinforcing resin 60 is impregnated into the whole area of the metal conductor 30, the impregnation depth d of the reinforcing resin 60 into the metal conductor 30 becomes larger than 30 micrometers (μm).

Next, the porous shape of the metal conductor 30 and the impregnation state of the reinforcing resin 60 will be described based on FIG. 6 to FIG. 8B.

FIG. 6 is a schematic sectional view schematically showing a section of the metal conductor 30 due to a SEM image, in a state before the impregnation of the reinforcing resin 60. As shown in FIG. 6, in the metal conductor 30, the metallic particles 32 made of Ag are joined by the metallic connection, and the pores 33 exist between the particles 32.

In the section of the metal conductor 30 shown in FIG. 6, the dimension 32a of a metallic particle 32 at the largest portion of the metallic particle 32 is as a metallic particle diameter 32a, the dimension of the largest portion of the pores 33 in the metal conductor 30 is as a pore diameter 33a, and a ratio of the area of the pores 33 to the entire area of the section of the metal conductor 30 is as a pore ratio. According to the inventor's SEM observation, the metal particle diameter 32a is in a range from 0.1 micrometer (μm) to 30 micrometers (μm), the pore diameter 33a is in a range from 0.1 micrometer (μm) to 50 micrometers (μm), and the pore ratio is in a range from 5% to 40%.

Figure 7A:
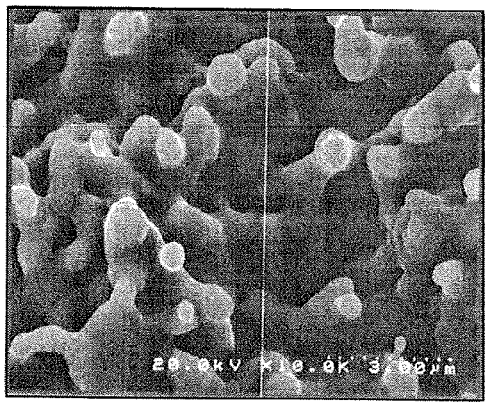
FIG. 7A is a microphotograph by SEM showing a section surface of the metal conductor in the state before the impregnation of the reinforcing resin.
Figure 7B:
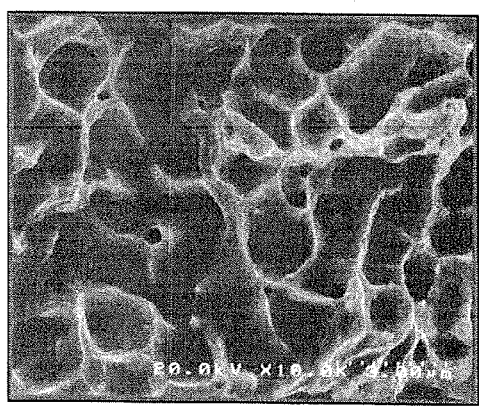
FIG. 7B is a microphotograph by SEM showing the section surface of the metal conductor in the state after the impregnation of the reinforcing resin.

FIG. 7A is a microphotograph by SEM showing the end surface 31 of the metal conductor 30 in the state before the impregnation of the reinforcing resin 60, and FIG. 7B is a microphotograph by SEM showing the end surface 31 of the metal conductor 30 in the state after the impregnation of the reinforcing resin 60. Specifically, FIG. 7B shows the state in which the impregnation depth is equal to or larger than 30 μm. From FIG. 7A, the shape of the Ag particles is confirmed as the metallic particle 32. In contrast, from FIG. 7B, a state, in which the Ag particles are covered with polyimide, is confirmed as the reinforcing resin 60.

FIGS. 8A and 8B are schematic sectional views showing the inside of the metal conductor 30 based on a SEM image. FIG. 8A shows the state of the metal conductor 30 before the impregnation of the reinforcing resin 60, and FIG. 8B shows a state of the metal conductor 30 in which the reinforcing resin 60 is impregnated by an impregnation depth equal to or larger than 30 μm.

Thus, the reinforcing resin 60 does not exist on the surface of the metallic particle 32 in FIG. 8A, while the surface of the metallic particle 32 is covered by the reinforcing resin 60 in FIG. 8B. According to the SEM observation, in the state where the impregnation depth of the reinforcing resin 60 is equal to or larger than 30 μm, the metal particles 32 are covered by the reinforcing resin 60 made of polyimide by the thickness t of 20 nm-5 μm.

That is, by filling the pores 33 of the metal conductor 30 with the reinforcing resin 60, the metal conductor 30 can be mechanically reinforced. Even if all the pores 33 are not filled with the reinforcing resin 60, when the thickness t of the reinforcing resin 60 in the pores 33 is larger than 5 μm, the reinforcement effect can be effectively improved. Thus, in some cross-section of the metal conductor 30, the pore ratio may be lower than 5%, or may be 0%.

In addition, in the present embodiment, preferably, a ratio of the Young's modulus of the mold resin 40 to the Young's modulus of the electronic component 10 is in a range from 0.5 to 2, and a ratio of the Young's modulus of the reinforcing resin 60 to the Young's modulus of the mold resin 40 is in a range from 1/100 to 1/10.

For example, the mold resin 40 of the present embodiment is made of an epoxy resin in which Young's modulus in normal temperature is about 100-330 Gap, which is about in a range of ½-2 of the Young's modulus of the electronic component 10 composed of a semiconductor. In addition, the Young's modulus in normal temperature of the reinforcing resin 60 is about 1-33 Gap, which is about in a range of 1/100-1/10 of the Young's modulus of the mold resin 40.

In addition, viscosity of the paste 70 shown in FIG. 2B is preferably in a range of about 0.05-15 Pa·s at a normal temperature, in order to suitably perform the impregnation. As the paste 70, a polyimide material made by Hitachi Chemical DuPont Microsystems, Inc., may be used. For example, the polyimide material as the paste 70 may be PIX1400 (brand name) with the viscosity of 1.1 Pa·s, a dilution article of the PIX1400 by NMP with the viscosity of 0.05 Pa·s, PIX3400 (brand name) with the viscosity of 13.0 Pa·s, and PIX6400 (brand name) with the viscosity of 0.1 Pa·s. Even in those cases, the effects of the present embodiment can be obtained.

Second Embodiment

Figure 9A:
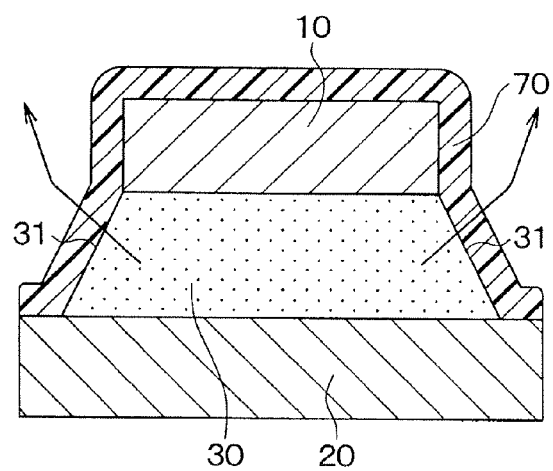
FIGS. 9A and 9B are a schematic sectional view showing a manufacturing method of an electronic device, according to a second embodiment of the present invention.
Figure 9B:
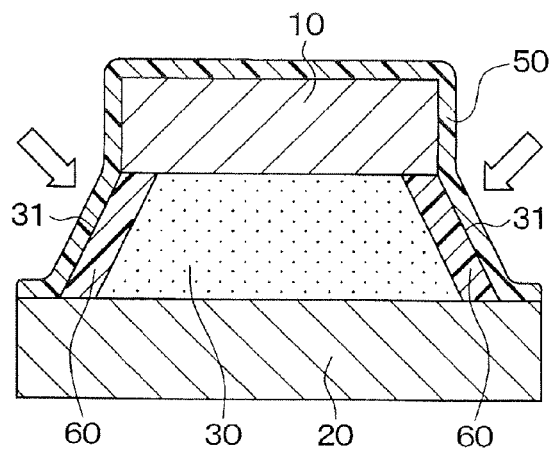

A second embodiment of the present application will be described with reference to FIG. 1, FIGS. 9A and 9B. FIGS. 9A and 9B are schematic sectional views showing a manufacturing method of an electronic device of the second embodiment. More specifically, FIGS. 9A and 9B show an impregnation process of the reinforcing resin 60, in the manufacturing method of the electronic device. In the second embodiment, different points of the manufacturing method, different from the above-described first embodiment, will be mainly described.

In the second embodiment, the electronic component 10 and the joining member 20 are mechanically joined via the metal conductor 30, as in the above-described first embodiment. Next, as shown in FIG. 9A, a paste 70, made of polyimide and NMP as a diluent of polyimide, is applied to the electronic component 10, the joining member 20 and the end surface 31 of the metal conductor 30. Here, the polyimide is the material for forming the primer 50 and the reinforcing resin 60.

Then, after the applying of the paste 70, the impregnation of the reinforcing resin 60 is performed in a decompression atmosphere. In the present embodiment, a space around the metal conductor 30 is decompressed to a pressure lower than the vapor pressure of the diluent of the paste 70 and lower than the atmospheric pressure. For example, in the present method, the vapor pressure of the diluent is lower than the atmospheric pressure.

Thus, the paste 70 can be introduced into the pores 33 of the metal conductor 30, and the diluent of the paste 70 in the pores 33 can be evaporated and removed. As shown by arrows in FIG. 9A, the evaporated diluent from the pores 33 can be discharged to the outside after passing through the paste 70.

In a case where the diluent is the NMP, the evaporated pressure of the diluent is 0.039 kPa at the temperature 20° C., which is smaller than 0.1 MPa of the atmospheric pressure. In the manufacturing method of the present embodiment, because air and diluent in the pores 33 are degassed at a pressure lower than the vapor pressure of NMP, the reinforcing resin 60 can be impregnated more deeply, and the NMP can be used as the diluents and can be removed effectively.

As a removal method of the diluent in the paste 70, a general heating and evaporating, for example at about 200° C., may be used. In this case, the diluent near the external surface of the paste 70 evaporates; however, the evaporation of the diluent in the deep position inside of the metal conductor 30 may be insufficient.

If the diluent remains in the pores 33 inside of the metal conductor 30, the strength of the metal conductor 30 may be deteriorated. For example, because the NMP tends to absorb moisture, it is easy to cause the strength deterioration. In contrast, according to the present embodiment, it is possible to effectively remove the NMP even in the pores 33 positioned at the deep position inside of the metal conductor 30, thereby preventing the strength deterioration of the metal conductor 30.

When the removing of the diluent is finished, and the reinforcing resin 60 is dried, the impregnating step is finished. At this time, the reinforcing resin 60 and the primer 50 are formed as shown in FIG. 9B. Thus, the metal conductor 30 is interrupted from the outside by the reinforcing resin 60.

That is, because the inner pores 33 in the metal conductor 30 are sealed by the reinforcing resin 60, the pressure in the pores 33 of the metal conductor 30 becomes lower than the atmospheric pressure outside the reinforcing resin 60, when the product shown in FIG. 9B is placed in the atmosphere.

Therefore, a compression force is applied to the metal conductor 30 based on a pressure difference between the pressure of the pores 33 in the metal conductor, and atmospheric pressure, as shown in the white arrow in FIG. 9B. As a result, the metal conductor 30 becomes in a restraining state restrained by the compression force, and therefore, a bending or a shift of the metal conductor 30 can be prevented. Thus, the electronic component 10 can be accurately joined to the joining member 20 via the metal conductor 30.

That is, in the impregnation step, the reinforcing resin 60 is impregnated in the pores 33 of the metal conductor 30, and at the same time, the pores 33 of the metal conductor 30 inside of the reinforcing resin 60 is sealed by the reinforcing resin 60. Because the impregnation is performed at a decompression state, the pressure of the metal conductor 30 inside of the reinforcing resin 60 becomes lower than that outside of the reinforcing resin 60, and therefore, the compression force is applied from the outside of the reinforcing resin 60 to the inside of the reinforcing resin 60.

After the impregnation step, the sealing due to the mold resin 40 is performed, thereby forming an electronic device of the present embodiment. The mold resin 40 is formed similarly to that shown in FIG. 1 of the above-described first embodiment.

Even in the present embodiment, the primer 50 may be made of a material different from the reinforcing resin 60. In this case, the primer 50 and the reinforcing resin 60 may be formed at different steps, as described in the above first embodiment. Even in this case, the decompression at a pressure lower than the vapor pressure of the diluent may be performed when the impregnation is performed, after the paste used as the reinforcing resin 60 is applied to the metal conductor 30. Furthermore, after the impregnation of the reinforcing resin 60, the primer 50 is formed.

In the present embodiment, as the paste 70 for forming the reinforcing resin 60, a resin material and its diluent may be used without being limited to the combination of polyimide and the NMP. For example, any one of polyimide and polyamide may be used as the resin material of the reinforcing resin 60, and an organic solvents other than NMP may be used as the diluent.

Third Embodiment

Figure 10A:
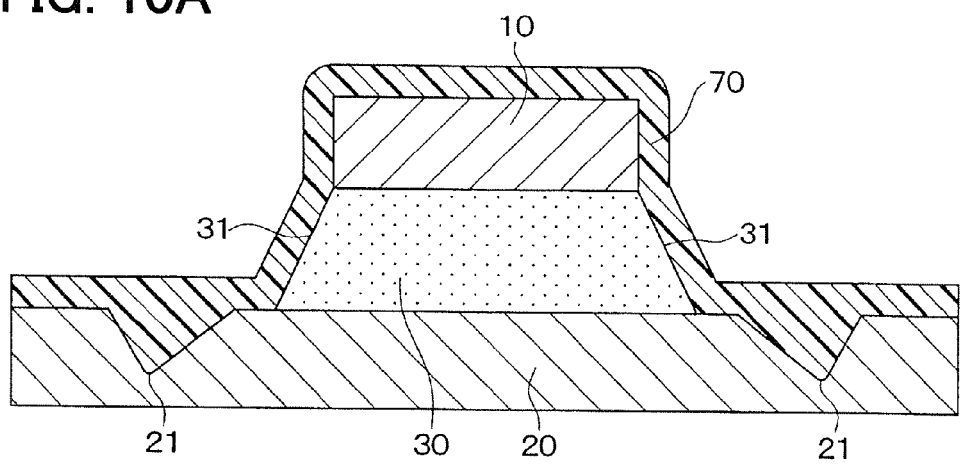
FIGS. 10A and 10B are a schematic sectional view showing a manufacturing method of an electronic device, according to a third embodiment of the present invention.
Figure 10B:
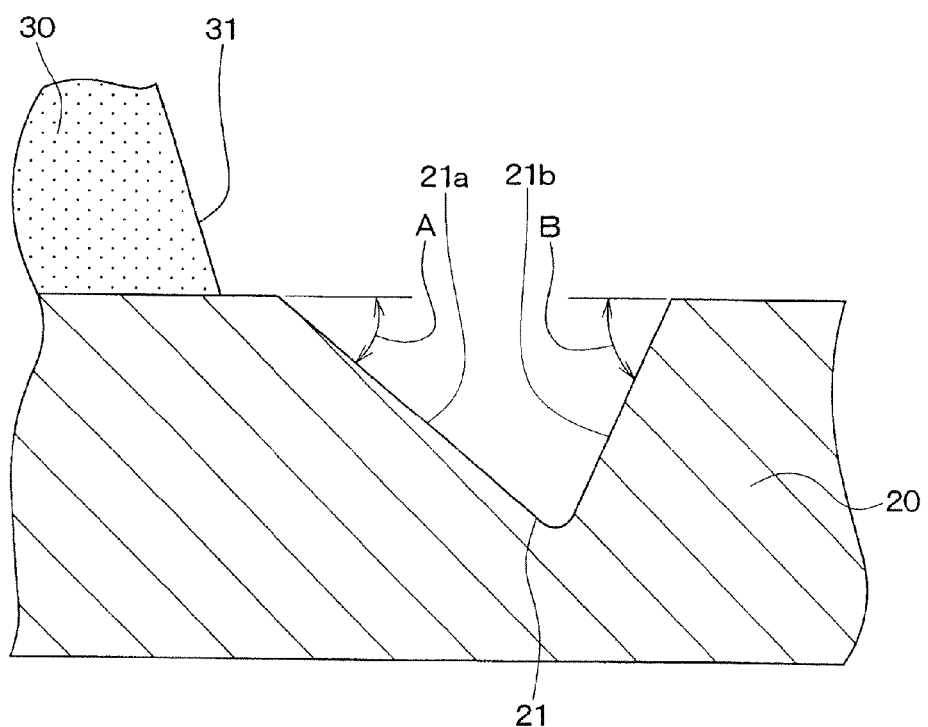

A third embodiment of the present invention will be described with reference to FIGS. 1, 10A and 10B. FIG. 10A is a schematic sectional view showing a manufacturing method of an electronic device of the third embodiment, and FIG. 10B is an enlarged view showing a part of the electronic device around a recess portion 21 of the joining member 20. More specifically, FIG. 10A shows an applying step of the paste 70 for forming the primer 50 and the reinforcing resin 60, in a manufacturing method of the electronic device.

In the present embodiment, the primer 50 and the reinforcing resin 60 may be made of the same paste 70 (same resin material). In this case, the following method of the present embodiment may be combined with the manufacturing method of the above-described first or second embodiment. In the third embodiment, different points of the manufacturing method, different from the above-described first embodiment, will be mainly described.

As shown in FIGS. 10A and 10B, a recess portion 21 is provided in a joining member 20 to be joined at a position outside of the end surface 31 of the metal conductor 30, to be engaged with a paste 70. Therefore, the paste 70 can be fastened to the joining member 20, by using the engagement. When the paste 70 is applied, the paste 70 is accumulated in the recess portion 21 to be fitted with the recess portion 21.

For example, the recess portion 21 may be formed into a V shape in the joining member 20 outside of the end surface 31 of the metal conductor 30, such that the paste 70 can be formed continuously at least from the inside of the recess portion 21 to the end surface 31 of the metal conductor 30. When the impregnation of the paste 70 proceeds, the amount of the paste 70 on the end surface 31 of the metal conductor 30, on the surface of the electronic component 10 and on the surface of the joining member 20 is decreased. At this time, because the paste 70 is also supplied to the recess portion 21, it can prevent the amount of the paste 70 from being excessively decreased on the end surface 31, on the surface of the electronic component 10 and the end surface of the joining member 20.

That is, in a case where the paste 70 for forming the reinforcing resin 60 is made of the same resin as that of the primer 50, the thickness of the primer 50 may be smaller than a desired thickness due to the impregnation of the paste 70 into the inside of the metal conductor 30. As shown in FIG. 4, the desired thickness of the primer 50 is in a range of 0.2-3.0 μm.

If the thickness of the primer 50 is reduced, it is necessary to apply again the paste 70 for keeping the desired thickness of the primer 50. In contrast, in the present manufacturing method, because the paste 70 stays in the recess portion 21 of the joining member 20, it is possible to keep the amount of the paste 70 at a sufficient amount, and thereby the thickness of the primer 50 after the impregnation can be sufficiently maintained at one applying step.

It is preferable to set the capacity of the recess portion 21 to be equal to or larger than an impregnation amount of the paste 70 impregnated into the metal conductor 30. The recess portion 21 is formed into a V shape such that the paste 70 in the recess portion 21 can be easily collected to a side of the end surface 31 of the metal conductor 30.

Specifically, the V-shaped recess portion 21 has a first slant surface 21a at the side of the end surface 31, and a second slant surface 21b opposite to the first slant surface 21a and crossed with the first slant surface 21a. The first slant surface portion 21a has a virtual angle A with respect to the top surface of the joining member 20, and the second slant surface portion 21b has a virtual angle B with respect to the top surface of the joining member 20. The virtual angle A is made smaller than the virtual angle B. The recess portion 21 is formed into a V shape by the first slant surface 21a on the side of the end surface 31 of the metal conductor 30, and the second slant surface 21b opposite to the first slant surface 21a.

In the third embodiment, the other parts may be similar to those of the above-described first or second embodiment.

Other Embodiments

Although the present invention has been fully described in connection with the preferred embodiments thereof with reference to the accompanying drawings, it is to be noted that various changes and modifications will become apparent to those skilled in the art.

In the electronic device according to any one of the above-described embodiments, the electronic component 10, the joining member 20, and the end surface of the metal conductor 30 are covered with the mold resin 40 through the primer 50. However, the primer 50 may be provided only on the end surface 31 of the metal conductor 30 without providing on the electronic component 10 and the joining member 20, if the adhesiveness of the electronic component 10 and the joining member 20 with the mold resin 40 can be secured.

The mold resin 40 may be not provided in the electronic device shown in FIG. 1, if the electronic device is provided with an electronic component 10, a joining member 20, a metal conductor 30 and a reinforcing resin 60. In this case, the metal conductor 30, located between the electronic component 10 and the joining member 20 to mechanically join the electronic component 10 and the joining member 30, is made of porous noble metal to have pores, and includes an end surface 31 without being covered by the electronic component and the joining member. Furthermore, the reinforcing resin 60 is impregnated from the end surface 31 of the metal conductor 30 to an inside of the metal conductor 30, to mechanically reinforce the metal conductor 30. In the electronic device, the other parts may be suitably changed without being limited to the any example in the above-described embodiments.

If the mold resin 40 is not provided, the primer 50 may be provided as in the state of FIG. 1, or the primer 50 may be omitted from the state shown in FIG. 1. In this case, the reinforcing resin 60 is made of a resin material having a reinforcing function for reinforcing the metal conductor 30.

Such changes and modifications are to be understood as being within the scope of the present invention as defined by the appended claims.

What is claimed is:

1. An electronic device comprising:
an electronic component;
a joining member to be mechanically joined with the electronic component;
a metal conductor arranged between the electronic component and the joining member to mechanically join the electronic component and the joining member, wherein:
the metal conductor is made of porous noble metal to have pores,
the metal conductor includes an end surface uncovered by the electronic component and the joining member, and
in a cross section of the metal conductor, the metal conductor before resin impregnation has:
a largest dimension of metal particles contained in the metal conductor is a metal particle diameter in a range larger than 0.2 μm and smaller than 15 μm;
a largest dimension of the pores contained in the metal conductor is a pore diameter in a range of 0.1 to 50 μm; and
a pores area ratio of areas of the pores to an entire area on the cross section of the metal conductor is in a range of 5 to 40%;
a mold resin configured to seal the electronic component, the joining member and the end surface of the metal conductor;
a primer arranged at least between the end surface of the metal conductor and the mold resin to increase an adhesiveness therebetween; and
a reinforcing resin impregnated from the end surface of the metal conductor to an inside of the metal conductor, to mechanically reinforce the metal conductor,
wherein the primer and the reinforcing resin are made of a same resin material, and the reinforcing resin has a higher adhesion strength with the primer than the metal conductor.

2. An electronic device comprising:
an electronic component;
a joining member to be mechanically joined with the electronic component;
a metal conductor of silver (Ag) arranged between the electronic component and the joining member to mechanically join the electronic component and the joining member, wherein the metal conductor is made of porous noble metal to have pores, and includes an end surface without being covered by the electronic component and the joining member;
a mold resin configured to seal the electronic component, the joining member and the end surface of the metal conductor;
a primer arranged at least between the end surface of the metal conductor and the mold resin to increase an adhesiveness therebetween; and
a reinforcing resin impregnated from the end surface of the metal conductor to an inside of the metal conductor by an impregnation depth that is equal to larger than 30 μm, to mechanically reinforce the metal conductor,
wherein the reinforcing resin and the primer are made of a same polyamide resin material, and the reinforcing resin has a higher adhesion strength with the primer than the metal conductor.

3. The electronic device according to claim 1, wherein
the metal conductor is made of silver (Ag),
the primer and the reinforcing resin are made of polyimide, and the reinforcing resin is impregnated from the end surface of the metal conductor to the inside of the metal conductor by an impregnation depth that is equal to or larger than 30 μm.

4. The electronic device according to claim 2, wherein
in a cross section of the metal conductor, the metal conductor before impregnation of the reinforcing resin has:
a largest dimension of metal particles contained in the metal conductor as a metal particle diameter; a largest dimension of the pores contained in the metal conductor as a pore diameter; and a ratio of areas of the pores to an entire area on the cross section of the metal conductor as a pores ratio, and
the metal particle diameter is in a range of 0.1 to 30 μm, the pore diameter is in a range of 0.1 to 50 μm, and the pores ratio is in a range of 5 to 40% in the cross section of the metal conductor.

5. The electronic device according to claim 2, wherein a thickness of the primer on the end surface of the metal conductor is in a range of 0.2 to 3 μm.

6. The electronic device according to claim 2, wherein
a ratio of Young's modulus of the mold resin to Young's modules of the electronic component is in a range of ½ to 2, and
a ratio of Young's modulus of the reinforcing resin to the Young's modulus of the mold resin is in a range of 1/100 to 1/10.

7. The electronic device according to claim 1, wherein the metal conductor is made of silver (Ag), and the reinforcing resin is made of polyimide.

8. A method of manufacturing the electronic device according to claim 2, comprising:
mechanically joining the electronic component and the joining member via the metal conductor made of the porous noble metal, such that the metal conductor has the end surface without being covered by the electronic component and the joining member;

applying a paste made of the polyamide resin material and a diluent for diluting the polyamide resin material; and decompressing a space around the metal conductor to a pressure lower than an atmosphere pressure and lower than a vapor pressure of the diluent to evaporate and remove the diluent in the pores while introducing the paste into the pores of the metal conductor, so as to impregnate the polyamide resin material from the end surface of the metal conductor into the pores within the metal conductor, wherein the decompressing is performed such that an inside of the metal conductor inside of the polyamide resin material is sealed by the polyamide resin material, and the inside of the metal conductor inside of the polyamide resin material has a pressure lower than a pressure outside of the metal conductor so as to apply a compression force from the outside of the metal conductor to the inside of the metal conductor.

9. The method according to claim 8, wherein a recess portion is formed in the joining member at a position outside the end surface of the metal conductor before the mechanically joining, and the applying of the paste is performed such that the paste is stored in the recess portion of the joining member.

10. A method of manufacturing the electronic device according to claim 1, comprising:

mechanically joining the electronic component and the joining member via the metal conductor made of the porous noble metal, the metal conductor having the end surface uncovered by the electronic component and the joining member;

applying a paste made of the polyamide resin material and a diluent for diluting the resin material; and decompressing a space around the metal conductor to a pressure lower than an atmosphere pressure and lower than a vapor pressure of the diluent to evaporate and remove the diluent in the pores while introducing the paste into the pores of the metal conductor, thereby impregnating the resin material from the end surface of the metal conductor into the pores within the metal conductor, wherein the decompressing is performed such that an inside of the metal conductor inside of the resin material is sealed by the resin material, and the inside of the metal conductor inside of the resin material has a pressure lower than a pressure outside of the metal conductor thereby applying compression force from the outside of the metal conductor to the inside of the metal conductor.

11. The method according to claim 10, wherein a recess portion is formed in the joining member at a position outside the end surface of the metal conductor before the mechanically joining, and the applying of the paste is performed such that the paste is stored in the recess portion of the joining member.

12. The electronic device according to claim 1, wherein a thickness of the primer on the end surface of the metal conductor is in a range of 0.2 to 3 μm.

13. The electronic device according to claim 1, wherein a ratio of Young's modulus of the mold resin to Young's modules of the electronic component is in a range of ½ to 2, and a ratio of Young's modulus of the reinforcing resin to the Young's modulus of the mold resin is in a range of 1/100 to 1/10.

* * * * *